United States Patent
Peck et al.

(10) Patent No.: US 6,822,454 B2
(45) Date of Patent: Nov. 23, 2004

(54) MICROFLUIDIC DEVICE WITH MULTIPLE MICROCOIL NMR DETECTORS AND FIELD GRADIENT FOCUSING

(75) Inventors: Tim L. Peck, Mahomet, IL (US); Dean Olson, Champaign, IL (US); Jim Norcross, Champaign, IL (US); David Strand, Sherborn, MA (US); Jonathan Sweedler, Urbana, IL (US)

(73) Assignee: Protasis Corporation, Marlboro, MA (US)

( * ) Notice: Subject to any disclaimer, the term of this patent is extended or adjusted under 35 U.S.C. 154(b) by 0 days.

(21) Appl. No.: 10/003,837

(22) Filed: Dec. 3, 2001

(65) Prior Publication Data

US 2002/0149369 A1 Oct. 17, 2002

Related U.S. Application Data

(60) Provisional application No. 60/250,874, filed on Dec. 1, 2000.

(51) Int. Cl.[7] ................................................ G01V 3/00
(52) U.S. Cl. ...................................... 324/321; 324/306
(58) Field of Search ................................. 324/318, 321, 324/322, 309, 306, 307; 435/29, 7.1

(56) References Cited

U.S. PATENT DOCUMENTS

| | | | |
|---|---|---|---|
| 5,304,487 A | 4/1994 | Wilding et al. ............... 435/29 |
| 5,654,636 A | 8/1997 | Sweedler et al. ............ 324/321 |
| 5,684,401 A | 11/1997 | Peck et al. .................. 324/318 |
| 5,928,880 A | 7/1999 | Wilding et al. ............. 435/7.21 |
| 6,026,316 A * | 2/2000 | Kucharczyk et al. ........ 600/420 |
| 6,097,188 A | 8/2000 | Sweedler et al. ............ 324/321 |
| 6,103,199 A | 8/2000 | Bjornson et al. ............ 422/100 |
| 6,194,900 B1 * | 2/2001 | Freeman et al. ............. 324/321 |
| 6,456,072 B1 * | 9/2002 | Webb et al. ................. 324/308 |
| 6,696,838 B2 * | 2/2004 | Raftery et al. .............. 324/321 |
| 6,700,379 B2 * | 3/2004 | Peck et al. .................. 324/321 |
| 2002/0105327 A1 * | 8/2002 | Peck et al. .................. 324/306 |
| 2002/0130661 A1 * | 9/2002 | Raftery et al. .............. 324/318 |
| 2002/0149369 A1 * | 10/2002 | Peck et al. .................. 324/321 |

FOREIGN PATENT DOCUMENTS

| | | | |
|---|---|---|---|
| DE | 19927976 | 1/2000 | |
| WO | 0050924 | 8/2000 | |
| WO | WO 200050924 A1 * | 8/2000 | ........... G01R/33/20 |

OTHER PUBLICATIONS

Written Opinion Dated Jun. 6, 2003, based on PCT/US01/46733.
Wu et al. (1994) Nanoliter Volume Sample Cells for $^1$H NMR: Application to On–Line Detection in Capillary Electrophoresis, Journal of the American Chemical Society V. 116, No. 17, pp. 7929–7930.
Olson et al (1995) High–Resolution Microcoil [1]NMR for Mass–Limited, Nanoliter–Volume Samples, Science V. 270, pp. 1967–1970.
Peck et al (1995) Design and Analysis of Microcoils for NMR Microscopy, Journal of Magnetic Resonance Series B 108, pp. 114–124.
Peck et al (1994) NMR Microspectroscopy Using 100 $\mu$m Planar RF Coils Fabricated on Gallium Arsenide Substrates, IEEE Trans. Biomed. Eng. 41(7) 706–709.
Stocker et al (1997) Nanoliter Volume, High–Resolution NMR Microspectroscopy Using a 60–$\mu$m Planar Microcoil, IEEE Trans Biomed. Eng. 44(11) 1122–1127.

(List continued on next page.)

Primary Examiner—Diego Gutierrez
Assistant Examiner—Tiffany A. Fetzner
(74) Attorney, Agent, or Firm—Banner & Witcoff, Ltd.

(57) ABSTRACT

An NMR system comprises an NMR probe comprising multiple NMR detection sites. Each of the multiple NMR detection sites comprises a sample holding void and an associated NMR microcoil. The NMR system further comprises a controllable fluid router operative to direct fluid sample to the multiple NMR detection sites.

2 Claims, 7 Drawing Sheets

OTHER PUBLICATIONS

Magin et al (1997) Miniature Magnetic Resonance Machines, IEEE Spectrum 34 51–61.

Trumbull et al (1998) Integrating Microfluidic Systems and NMR Spectroscopy: Preliminary Results, Solid–State Sensor and Actuator Workshop Hilton Head Island, South Carolina, Jun. 8–11.

Trumbull et al (2000) Integrating Microfabricated Fluidic Systems and NMR Spectroscopy, 47(1) 1–6.

Haner et al (2000) Small Volume Flow Probe for Automated Direct–Injection NMR Analysis: Design and Performance, Journal of Magnetic Resonance 143, pp. 69–78.

Li et al (1999) Multiple Solenoidal Microcoil Probes for High–Sensitivity, High–Throughput Nuclear Magnetic Resonance Spectroscopy, Anal. Chem. 71, pp. 4815–4820.

Fisher et al (1999) NMR Probe for the Simultaneous Acquistion of Multiple Samples, Journal of Magnetic Resonance 138, pp. 160–163.

Huang et al (1999) Digitally Controlled Electrophoretic Focusing, Analytical Chemistry 71(8) 1628–1632.

Koegler et al (1996) Focusing Proteins in an Electric Field Gradient, Journal of Chromatography A, pp. 229–236.

Koegler et al (1996) Field Gradient Focusing: A Novel Method for Protein Separation, American Chemical Society.

Hou et al (2000) Analysis of Multiple Samples Using Multiplex Sample NMR: Selective Excitation and Chemical Shift Imaging Approaches, Analytical Chemistry.

Bayer et al (1979) On–Line Coupling of High–Performance Liquid Chromatography and Nuclear Magnetic Resonance, Journal of Chromatography 186, pp. 497–507.

Watanabe et al (1978) Direct–Coupling of FT–NMR to High Performance Liquid Chromatography, Proc. Japan Acad., vol. 54(B).

Dechow J et al: "Fabrication of NMR Microsensors for Nanoliter Sample Volumes" vol. 53, No. 1–4, Jun. 2000 International Search Report based off of PCT/US/46733.

* cited by examiner

MICROFLUIDIC DEVICE WITH MULTIPLE MICROCOIL NMR DETECTORS AND FIELD GRADIENT FOCUSING

PRIORITY

This application claims priority benefit of U.S. provisional patent application Ser. No. 60/250,874 filed on 1 Dec. 2000, entitled "Multi-flowcell Microcoil NMR Detector Probe."

FIELD OF THE INVENTION

The present invention is directed to microfluidic devices having multiple microcoil nuclear magnetic resonance (NMR) detectors and, more particularly to microfluidic devices having improved microcoil NMR detectors for capillary-scale, high resolution NMR spectroscopy probes capable of enhanced sample processing functionality.

BACKGROUND

Nuclear magnetic resonance spectroscopy, or NMR, is a powerful and commonly used method for analysis of the chemical structure of molecules. NMR provides spectral information as a function of the electronic environment of the molecule and is nondestructive to the sample. In addition, reaction rates, coupling constants, bond-lengths, and two- and three-dimensional structure can be obtained with this technique.

Systems for biochemical, chemical, and molecular analysis can be miniaturized as capillary-based systems or substrate-based, i.e., micro-scale, systems with multifunctional capabilities including, for example, chemical, optical, fluidic, electronic, acoustic, and/or mechanical functionality. Miniaturization of these systems offers several advantages, including increased complexity, functionality, and efficiency. Devices can be fabricated from diverse materials including, for example, plastics, polymers, metals, silicon, ceramics, paper, and composites of these and other materials. Mesoscale sample preparation devices for providing microscale test samples are described in U.S. Pat. No. 5,928,880 to Wilding et al. Devices for analyzing a fluid sample, comprising a solid substrate microfabricated to define at least one sample inlet port and a mesoscale flow channel extending from the inlet port within the substrate for transport of a fluid sample are described in U.S. Pat. No. 5,304,487. Currently known miniaturized fluid-handling and detection devices have not met all of the needs of industry.

NMR is one of the most information-rich forms of biochemical, chemical, and molecular detection and analysis, and remains highly utilized in a wide range of health-related industries, including pharmaceutical research and drug discovery. One of the fundamental limitations of NMR for these and other applications involves sample throughput. When compared to other forms of detection (e.g., mass spectrometry), the amount of sample required by NMR is generally orders of magnitude greater, and correspondingly the mass limits of detection are generally orders of magnitude poorer. Conventional NMR spectrometers typically use relatively large RF coils (mm to cm size) and samples in the ml volume range, and significant performance advantages are achieved using NMR microcoils when examining very small samples. Prior to such development of microcoil NMR and NMR flowprobes, NMR remained a test tube-based analytical technique requiring milliliters of sample and often requiring data acquisition times ranging from 10 min. to several hours for informative spectra with sufficient signal to noise ratio ("S/N").

NMR microcoils are known to those skilled in the art and are shown, for example, in U.S. Pat. No. 5,654,636 to Sweedler et al., and in U.S. Pat. No. 5,684,401 to Peck et al., and in U.S. Pat. No. 6,097,188 to Sweedler et al., all three of which patents are incorporated herein by reference in their entireties for all purposes. A solenoid microcoil detection cell formed from a fused silica capillary wrapped with copper wire has been used for static measurements of sucrose, arginine and other simple compounds. Wu et al. (1994a), J. Am. Chem. Soc. 116:7929–7930; Olson et at. (1995), Science 270:1967–1970, Peck (1995) J. Magn. Reson. 108(B) 114124. Coil diameter has been further reduced by the use of conventional micro-electronic techniques in which planar gold or aluminum R.F. coils having a diameter ranging from 10–200 $\mu$m were etched in silicon dioxide using standard photolithography. Peck 1994 IEEE Trans Biomed Eng 41(7) 706–709, Stocker 1997 IEEE Trans Biomed Eng 44(11)1122–1127, Magin 1997 IEEE Spectrum 34 51–61, which are also incorporated herein by reference in its entirety for all purposes. In Stocker et al. a microcoil was fabricated on a gallium arsenide substrate with an inner diameter of 60 $\mu$m, an outer diameter of 200 $\mu$m, trace width of 10 $\mu$m, trace spacing of 10 $\mu$m, and trace height of Sum. At 5.9T (250 MHz) in 1H-NMR micro spectroscopy experiments using a spectral width of 1 kHz, 4096 sampled data points, and a recovery delay of 1 s, a SNR of 25 (per acquisition) and a spectral line width of less than 2 Hz were obtained from a sample of water.

Miniature total analysis systems ($\mu$-TAS) are discussed in Integrating Microfluidic Systems And NUR Spectroscopy—Preliminary Results, Trumbull et al, Solid-State Sensor and Actuator Workshop, pp. 101–05 (1998), Magin 1997 IEEE Spectrum 34 51–61, and Trumbull 2000 47(1)1–6 incorporated herein by reference in its entirety for all purposes. These groups constructed chip-based capillary electrophoresis (CE) devices equipped with an integrated planar radio frequency detector coil used for nuclear magnetic resonance spectroscopy (NN R). Separations were accomplished in the devices, but satisfactory NMR spectra could only be obtained from samples of high concentration. Two prototype CE-NMR devices are presented that represent complete microanalytical instruments. Further, "The first system, Trident, was designed to be a proof-of-concept fluidic-NMR device to gauge the effectiveness of integrated, single-turn planar NMR coils. The channel network was formed by solvent bonding a photopatterned polyimide coating (on a glass slide) with a cover-glass coated with a thin layer of polyimide. Holes were previously drilled ultrasonically in the glass slide to provide access. A lift-off process was used to create a 1 mm diameter, single-turn coil on the outer surface of the cover glass. The metal was formed from 3 evaporated layers: Cr/Cu/Cr with respective thicknesses of 150, 9700, and 150 angstroms for improved susceptibility matching. The resistance of the coil, pad to pad, was measured to be 5.90. Acrylic wells were then placed over the drilled holes and bonded with epoxy. The second device type created, SpinCollector shown in FIG. 1 blowups, was made from etched glass channels using methods developed from (D. J. Harrison and N. Chiem, "Immunoassay Flow Systems On-Chip," TRF, pp. 5–8., 1996). Annealed Pyrex glass wafers (1 mm thick) were etched in HF and HNO3 to a depth of 20 $\mu$m through a Cr/Au mask. Access holes were drilled ultrasonically and, the mask was stripped. The wafers were then cleaned in a 1% HF bath for 1 minute with ultrasonic agitation to remove any loose glass particles. After thorough cleaning, the wafers were thermally bonded to unprocessed pieces forming closed channels. A 5 mm diameter, single-turn coil was then formed through lift-off on the undrilled cover-glass slide over the disk-shaped reservoir, and glass wells were attached using epoxy. The Trumbull et al. device integrated multiple chemical processing steps and the means of analyzing their results on the same miniaturized system. Specifically, Trumbull et al. coupled chip-based capillary electrophoresis (CE) with nuclear magnetic resonance spectroscopy (NMR) in a µ-TAS system.

Capillary-based liquid chromatography and microcoil NMR have compatible flow rates and sample volume requirements. Thus, for example, the combination of the Waters CapLC™ available from Waters Corporation (Milford, Mass., USA) and the MRM CapNMR™ flow probe available from MRM Corporation (Savoy, Ill.), a division of Protasis Corporation (Marlborough, Mass., USA) provides excellent separation capability in addition to UV-VIS and NMR detection for mass-limited samples. The Waters CapLC™ has published flow rates from 0.02 µL/minute to 40 µL/minute. A typical CapLC on-column flow rate is 5 µL/min, the autosampler-injected analyte volume is 0.1 µL or more, and accurate flow rates are achieved through capillary of typically 50 µm inner diameter. The NMR flow cell has a typical total volume of 5 µL with a microcoil observe volume of 1 µL. A typical injected sample amount for CapLC-µNMR analysis is a few µg (nmol) or less.

Capillary scale systems also are shown in U.S. Pat. No. 6,194,900, the entire disclosure of which is incorporated herein by reference for all purposes. In such systems, a capillary-based analyte extraction chamber is connected to an NMR flow site, such as by being positioned as an operation site along a capillary channel extending to the NMR flow cell.

Small volume flow probes are shown, for example, by Haner et al. in Small Volume Plow Probe for Automated Direct-Injection NAM Analysis: Design and Performance, J. Magn. Reson., 143, 69–78 (2000), the entire disclosures of which is incorporated herein by reference for all purposes. Specifically, Harter et al show a tubeless NMR probe employing an enlarged sample chamber or flowcell. In Haner et al., a 600 MHz, indirect detection NMR flow probe with a 120 µL active volume is evaluated in two configurations: first as a stand-alone small volume probe for the analysis of static nonflowing solutions, and second as a component in an integrated liquids-handling system used for high-throughput NMR analysis. Key advantages of the flowprobe include high molar sensitivity, ease of use in an automation setup, and superior reproducibility of magnetic field homogeneity, which enables the practical implementation of 1 D T2-edited analysis of protein-ligand interactions. Microcoil-based micro-NMR spectroscopy is disclosed in U.S. Pat. Nos. 5,654,636, 5,684,441, and 6,097,188, the entire disclosures of all of which are incorporated herein by reference for all purposes. Sample amounts can now range as small as several hundred microliters for conventional flowprobes to smaller than 1 µL for microcoil-based capillary-scale flowprobes. Acquisition times typically range from minutes to hours. The most expensive and technologically limiting component of the NMR system is the superconducting magnet. Although significant financial and technical investment has been made in the development of elaborate mechanical (robotic-controlled) sample changers and, more recently, automated flow injection systems for repetitive and continuous sample throughput, the magnet remains today a dedicated component in which only sequential, one-at-a-time analysis of samples is carried out.

NMR is one of the few analytical methods in which parallel data acquisition has not been applied to increase sample processing functionality, such as the number of samples that can be tested in a given time. At least some of the difficulties in accomplishing this objective are intrinsically related to the hardware involved in NMR data acquisition.

Recent academic results have shown that some of the limitations of NMR processing can be overcome by the use of multiple microcoil detectors in a wide-bore magnet. Proposed designs for incorporating multiple solonoidal microcoils into a single probe head are presented by Li et al. in *Multiple Solenoidal Microcoil Probes for High-Sensitivity, High-Throughput Nuclear Magnetic Resonance Spectroscopy*, Anal. Chem., 71, 4815–4820, 1999. A dual channel probe for simultaneous acquisition of NMR data from multiple samples is shown by Fisher et al. in *NMR Probe for the Simultaneous Acquisition of Multiple Samples*, J. Magn. Reson., 138, 160–163 (1999). Such devices, however, have not been commercially implemented and have not been shown to be commercially viable. In addition, higher numbers of multiple microcoil detectors are needed that are compatible also with narrow bore magnets, since narrow bore magnets are predominant in industrial settings. There is also both need for and benefit of microcoil NMR probes having enhanced sample processing functionality.

Accordingly, it is an object of the present invention to provide multi-microcoil NMR microfluidic devices having enhanced sample processing functionality. It is a particular object of the invention to provide improved microcoil NMR detectors for capillary-scale, high resolution NMR spectroscopy probes that can be adapted in accordance with certain preferred embodiments for use in large or small bore magnets and that are capable of enhanced sample processing functionality. Given the benefit of this disclosure, additional objects and features of the invention, or of certain preferred embodiments of the invention, will be apparent to those skilled in the art, that is, those skilled in this area of technology.

SUMMARY

In accordance with a first aspect, an NMR system comprises an NMR probe comprising multiple NMR detection sites. Each of the multiple NMR detection sites comprises a sample holding void and an associated NMR microcoil. The NMR system further comprises a controllable fluid router operative to direct fluid sample to the multiple NMR detection sites. In accordance with certain preferred embodiments, the multiple NMR sites are integrated in a probe module further disclosed below. In accordance with certain preferred embodiments, each of the NMR detection sites is in a capillary-scale fluid channel in the module. In accordance with certain preferred embodiments, each of the NMR detection sites is in a micro-scale fluid channel in the module. In accordance with certain preferred embodiments, the controllable fluid router is operative in response to an electrical input signal, especially to direct fluid sample to any selected ones of the NMR detection sites. In accordance with certain preferred embodiments, the NMR system further comprises a controller unit in communication with the router and operative to generate the input signal to the router. In certain embodiments the NMR system controller unit is operative to receive information from any of the multiple NMR detection sites and to generate the input signal to the router based at least in part on that information. In accordance with certain preferred embodiments, the NMR system further comprises a data processing unit which may be remote from the probe module or integral therewith. The data processing unit can provide the aforesaid input signal to the controllable router.

In accordance with a second aspect, an NMR probe comprises multiple NMR detection sites as disclosed above, each comprising a sample holding void and an associated NMR microcoil, and a controllable fluid router operative to direct fluid sample to the multiple NMR detection sites.

In accordance with another aspect, an NMR "smart probe" comprises multiple NMR detection sites, each comprising a sample holding void and an associated NMR microcoil, a controllable fluid router operative in response to an electrical input signal to direct fluid sample to the multiple NMR detection sites, and a controller unit in communication with the router and operative to generate the input signal to the router.

In accordance with another aspect, an NMR probe module is provided, e.g., a module suitable to be interchangeably (i.e., removeably and optionally reuseable) installed in certain preferred embodiments of the NMR probes disclosed above. Such probe modules comprise at least one fluid inlet port operative to receive a fluid sample, a fluid pathway comprising multiple channels in fluid communication with the inlet port, for the transport of fluid sample to be tested, multiple NMR detection sites, each in fluid communication with at least one of the multiple channels and each comprising a sample holding void and an associated NMR microcoil, and a controllable fluid router operative to direct fluid sample in the module to at least a selected one of the multiple channels.

The multiple NMR sites optionally can be optimized for different nuclear species and/or for 1 or 2 dimensional NMR study, e.g., the sites can be optimized similarly or differently, using different materials, such as fused silica and PEEK, fused silica and polytetrofluoroethylene and/or other suitable materials known to those skilled in those skilled in the art.

In accordance with another aspect, an NMR probe module comprises at least one fluid inlet port, operative to receive a fluid sample, a fluid pathway comprising multiple channels in fluid communication with the at least one fluid inlet port, for the transport of fluid sample to be tested, and multiple NMR detection cells, each in fluid communication with a corresponding one of the multiple channels. Each of the multiple NMR detection cells comprises an associated NMR microcoil and an enlarged void for holding a fluid sample. In certain preferred embodiments, the NMR probe module further comprises a controllable fluid router as disclosed above.

BRIEF DESCRIPTION OF THE DRAWINGS

The foregoing and other features and advantages of the present invention will be more fully understood from the following detailed description of an illustrative embodiment taken in conjunction with the accompanying drawings in which.

DETAILED DESCRIPTION

Figure 1:
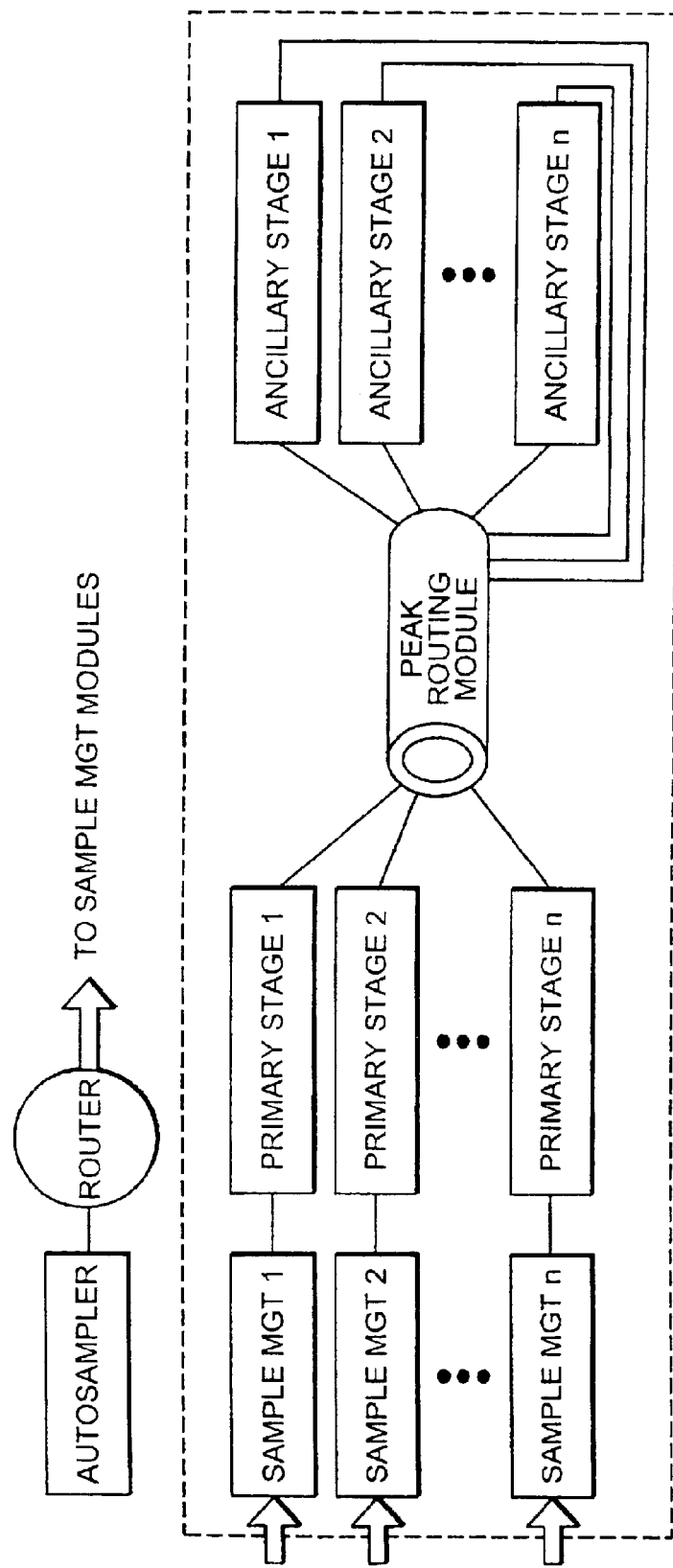
FIG. 1 is a schematic block diagram of a preferred embodiment of the NMR system disclosed here.

It will be recognized by those skilled in the art that numerous different embodiments of the systems, probes and modules disclosed here can be produced and used for various different applications. In capillary-based embodiments analyte sample fluid has a fluid flow rate typically less than about 5 $\mu$L/minute. In substrate-based, i.e., micro-scale, embodiments the analyte sample fluid has a fluid flow rate typically less than 1 $\mu$L/minute. In certain preferred embodiments, a miniaturized analysis system is employed for liquid phase sample analysis. Such embodiments, referred to in some instances here and in the appended claims as substrate-based, employ a microfabricated support body or manifold in the form of a cylinder, chip, laminated planar substrate or the like, insertable, e.g., removeably insertable, such as a set of interchangeable modules or the like. Typically in such embodiments the module has one or more straight or branched microfabricated microchannels and the probe has an inlet port for feeding fluid from an external source into the manifold. Multiple NMR detection sites each comprising an NMR RF microcoil in the module are in fluid communication with the inlet via one or more of the microfabricated microchannels. As used here, the terms "micro-scale" and "microfluidic" means the manifold operates effectively on micro-scale fluid samples, typically having volumes less than about 1 uL (i.e., 1 microliter), e.g., about 0.1 microliter to 1.0 microliter, and fluid flow rates less than about 1 uL/min, for example 100 nanoliters/min. The term "microscale" also refers to flow passages or channels and other structural elements of a substrate, e.g., a multi-layer laminated substrate. For example, 1 or more microchannels of a module substrate preferably have a cross-sectional dimension (diameter, width or height) between 500 microns and 100 nanometers. Thus, at the small end of that range, the microchannel has cross-sectional area of about 0.01 square microns. Such microchannels within a laminated substrate of the module, and chambers and other structures within the laminated substrate, when viewed in cross-section, may be triangular, ellipsoidal, square, rectangular, circular or any other shape, with at least one and preferably all of the cross-sectional dimensions transverse to the path of fluid flow is microscale. It should be recognized, that one or more layers of a laminated substrate may in certain embodiments have operative features, such as fluid channels, reaction chambers or zones, accumulation sites etc. that are larger than microscale. The modules disclosed here provide effective microcoil NMR devices and systems with good speed of analysis, decreased sample and solvent consumption, increased detection efficiency, and in certain embodiments disposable fluid-handling devices.

The multiple NMR detection sites preferably are used in systems further comprising one or more analyte extraction chambers. Thus, analyte fluid sample may be produced in an analyte extraction chamber and fed, directly or indirectly (i.e., with or without intervening processing or storage) to the multiple NMR detection sites. The detection sites may be used in parallel, in series or as alternatives to each other depending, e.g., on characteristics of the analyte sample. Optionally such characteristics may be determined by an operative component of the system, e.g., an operative component integrated on-board an embodiment of the probe modules disclosed here. The term "analyte extraction chamber" means a column or other operative zone or site or the like for focusing or concentrating analyte from a sample fluid into an analyte sample fluid, typically involving a many-fold reduction in fluid volume. The analyte extraction chamber may be in a separate or stand-alone device, e.g., an LC column, with fluid communication to the NMR probe via any suitable conduit, e.g., a fluid delivery tube controlled by an autosampler. The analyte extraction chamber preferably is a capillary-based analyte extraction chamber integrated into the NMR probe, e.g., as an operation site along a fluid channel extending within the probe to the NMR detection site or is integrated on-board a substrate-based module. Preferably, the analyte extraction chamber is operative to perform liquid chromatography, capillary electrophoresis, dynamic field gradient focusing, electric field gradient focusing or the like. In the case of an LC column in the form of a capillary-based analyte extraction chamber operative to perform solid phase extraction (SPE) or integrated into a substrate-based NMR probe (in some instances referred to here as an on-board LC chamber or on-board LC device), an analyte peak will be stepped off the column or other analyte extraction chamber, i.e., released into the NMR probe fluid channel, when the relative proportion of analyte solvent (e.g., an organic solvent) in the analyte sample fluid reaches a sufficient concentration.]

Referring now to the drawings, FIG. 1 is a schematic representative of an electrofluidic system in accordance with the present disclosure. A multiplicity of sample management modules are in operative electrical and fluidic communication with a multiplicity of primary stage detectors, a peak management module, and a multiplicity of ancillary stage detectors. Sample introduction can be from a variety of introduction means well known to those skilled in the art, and may include autosamplers with or without additional means of solid phase extraction. In general, the flow of information and fluid transport depicted in FIG. 1 can proceed in either direction. For example, with the appropriate plumbing as understood by those skilled in the art, a storage loop used for sample introduction can be reused for sample storage, e.g. as a fraction collector at the end of the experiment. Furthermore, the figure should be considered sufficiently general as to represent the combination of any number of individual components, for example, the case where a single sample management module is used with a multiplicity of ancillary stage detectors. The sample management platforms are sufficiently sophisticated to be in operative electrical and fluidic communication with each other. One embodiment of this configuration is where each of the detection stages are NMR microcoil detectors. A preferred embodiment is where all detectors are integrated into the probe manifold but are not limited to NMR, e.g. UV, IR, and other NMR-compatible (predominantly non-magnetic) means of detection. The peak management module can include sample storage and routing capabilities, but can also include a means of sample management, e.g. solid phase extraction. In a most preferred embodiment, the components shown are predominantly integrated into a probe module, such as those of FIGS. 3–8, with intelligent control of the overall processes being directed at least in part by electrical and fluidic processing elements in (i.e., on-board) the probe, e.g. microprocessors in operative communication with the detectors and fluidic management components shown in the drawings.

Figure 2:
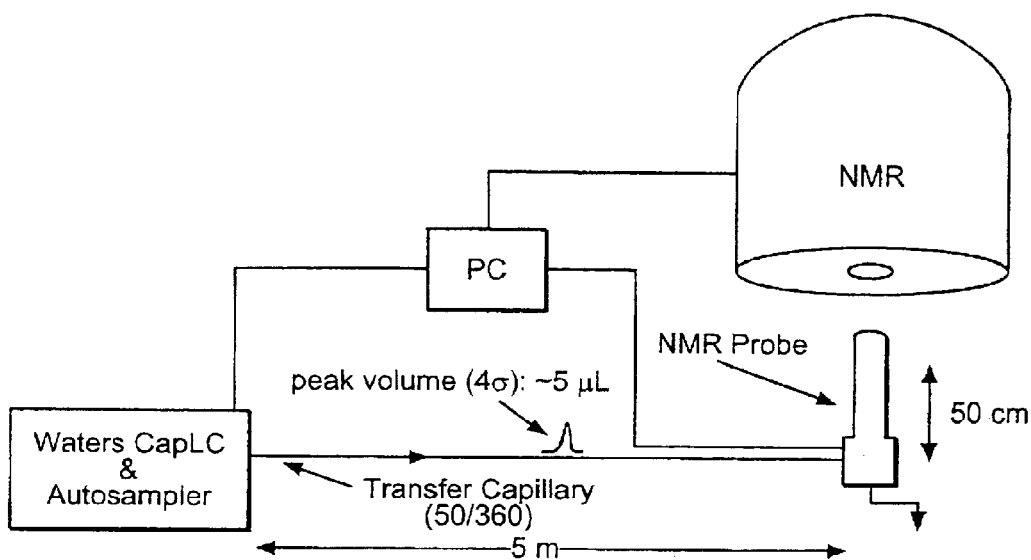
FIG. 2 is a schematic illustration of a preferred embodiment of a NMR probe and other components of the system of FIG. 1.

FIG. 2 illustrates a preferred embodiment of the system of FIG. 1, including a means of sample management (Waters CapLC and Sparc autosampler) external to the NMR probe, a primary stage detector (Waters photodiode array) external to the NMR probe, and a capillary-based NMR detection probe in operative electrical and fluidic communication with the sample management system and with the NMR spectrometer for effective control of analysis through a computer external to the probe. In an alternative preferred embodiment, some or all of these components would reside in (i.e., on-board) the probe, or even be provided as microscale components integrated on-board a substrate-based module, thereby improving efficiency, electrical and fluidic integrity, and promoting integration and complexity.

Figure 3:
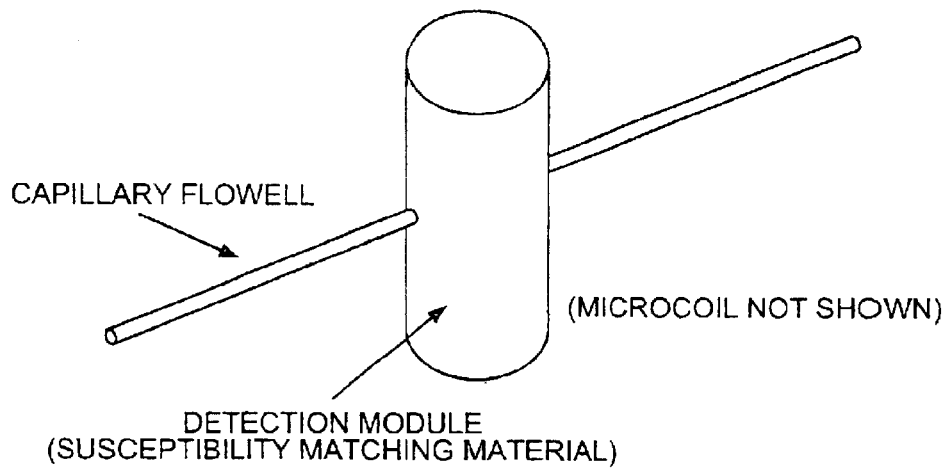
FIG. 3 is a schematic view, partially broken away, of a NMR detection site of the system of FIG. 1 in a preferred orientation relative to the module; module
Figure 4:
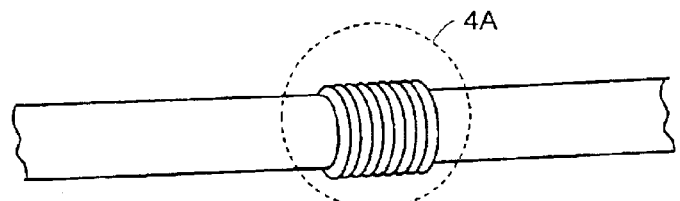
FIG. 4 is an enlarged schematic view, partially broken away, of the sample holding void and associated microcoil of the NMR detection site of FIG. 3, showing a further enlarged view of same.
Figure 4A:
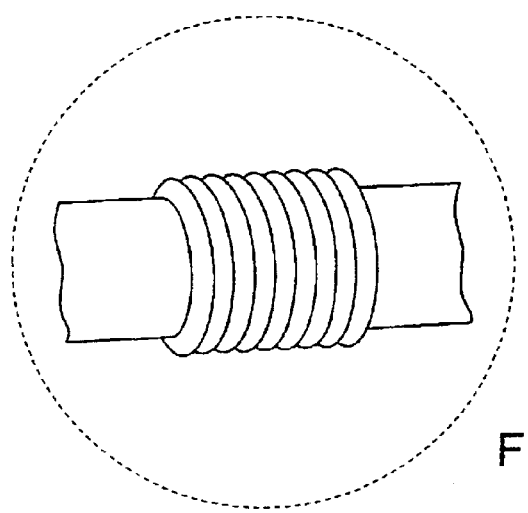
Figure 5:
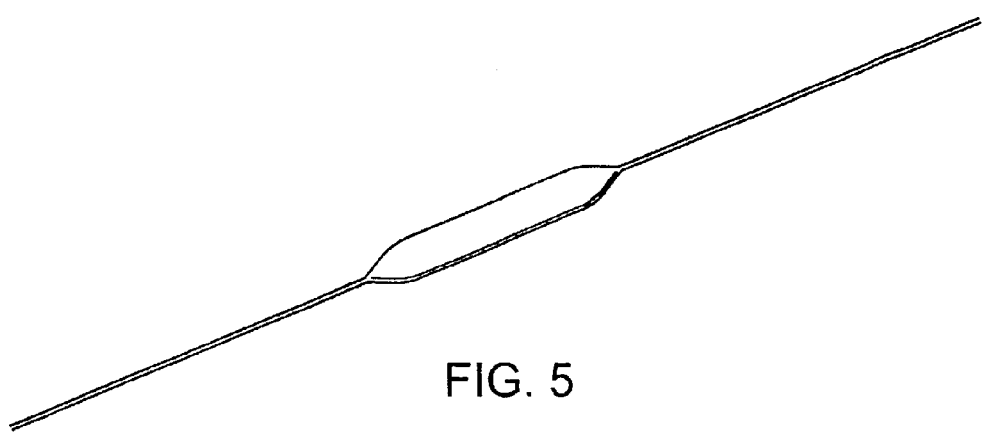
FIG. 5 is a perspective view of the enlarged void of a NMR detection cell in accordance with a preferred embodiment, the NMR microcoil being broken away.
Figure 6:
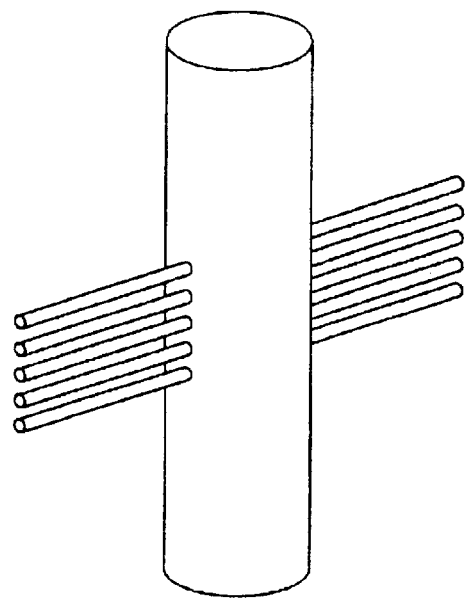
FIGS. 6–8 are schematic illustrations of alternative preferred embodiments of NMR probe modules, each showing detection site orientation, with the top of the page being upward into an NMR magnet.
Figure 7:
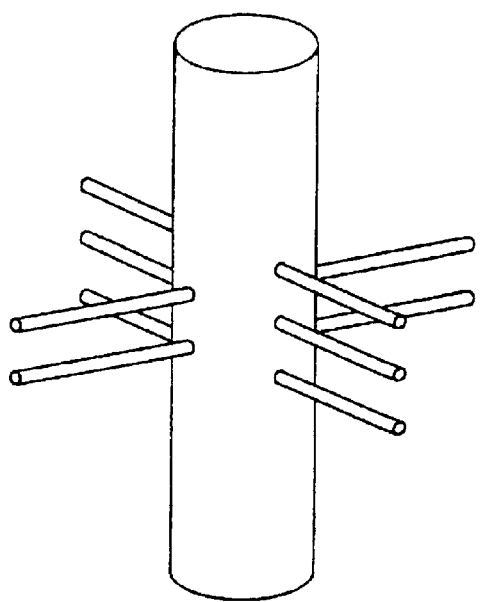
Figure 8:
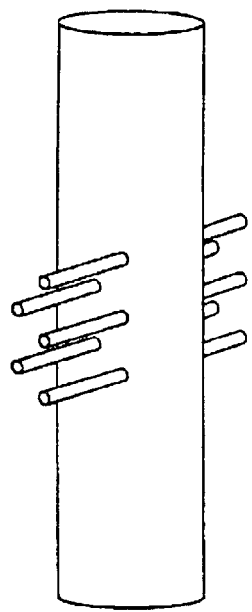

FIGS. 3–8 show a key aspects of the NMR probe, i.e., exemplary NMR detection modules suitable for capillary-scale embodiments. The NMR detection modules would preferably contain a multiplicity of primary and/or ancillary NMR detectors, and would be in operative communication with the other elements of the system of FIG. 1. FIG. 3 shows a single detection site in a module, the detection site being defined here as a combination of a capillary having an enlarged region and a microcoil NMR detector associated therewith. FIG. 4 shows a cutaway view of another detection module embodiment, illustrating the microcoil wrapped on a capillary. FIG. 5 shows an enlarged region of fluidic pathway (inner diameter of the capillary). FIG. 6–8 show alternative preferred embodiments of geometrical positioning of multiple NMR detection sites or cells in a single detection module. Although five detection cells are illustrated, the concept presented herein applies generally to any number of detection sites in a module. Also, it should be understood that alternative embodiments of the probes and systems disclosed here may employ multiple modules.

Figure 9:
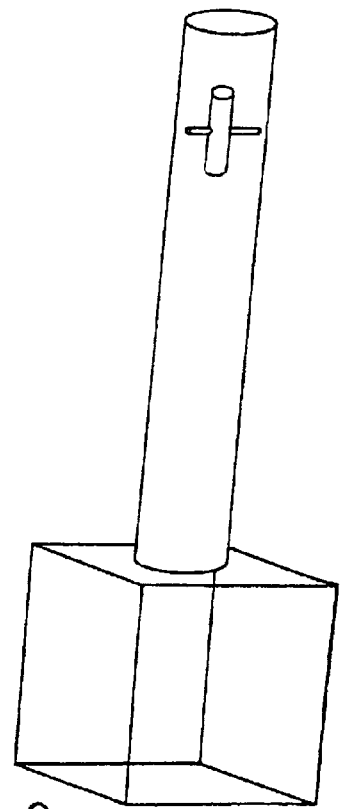
FIG. 9 is a schematic perspective view fan embodiment of a NMR probe, showing the orientation of a probe module within the probe.
Figure 10:
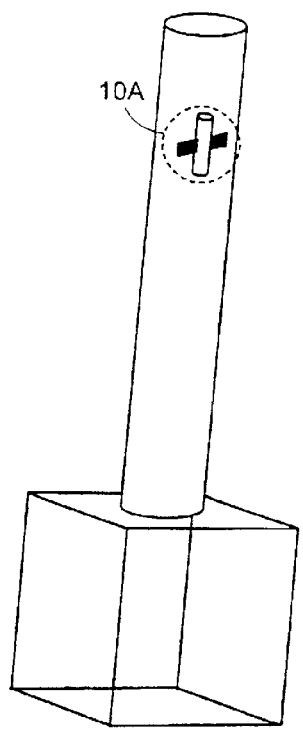
FIG. 10 is a schematic perspective view of an embodiment of a NMR probe, showing in enlarged break-out view the orientation of a probe module within the probe; module
Figure 11:
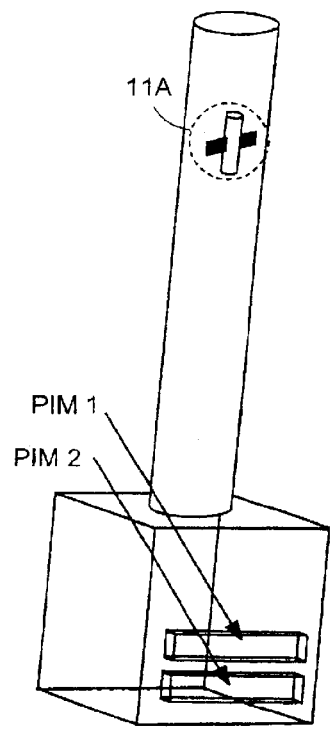
FIG. 11 is a schematic perspective view of an embodiment of a NMR probe comprising operative components in communication with a probe module, showing in enlarged break-out view the orientation of the probe module within the probe.
Figure 10A:
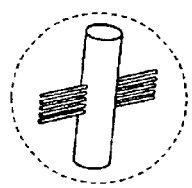
Figure 11A:
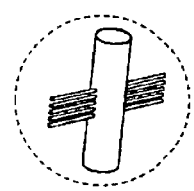

FIG. 9–11 show representative embodiments of the NMR probes disclosed here. FIG. 9 shows a typical probe (wire frame mesh) and illustrates the orientation/position of the detection module relative to a module base. The module would be inserted upwardly (as viewed in the drawing) into an NMR magnet. FIG. 10 shows a module similar to FIG. 9 but having multiple detection sites or cells. FIG. 11 shows another similar probe, but having multiple operative components integrated into the probe, specifically, plug-in modules (PIMs). The PIMs can be in operatively in electrical communication and/or operatively in fluidic communication with one or more detection sites, and may contain fluidic (e.g., sample management, e.g. LC, CE, DFGF) processors or electrical (e.g. electronic, hardware, software, e.g. digital computer) processors.

Figure 12:
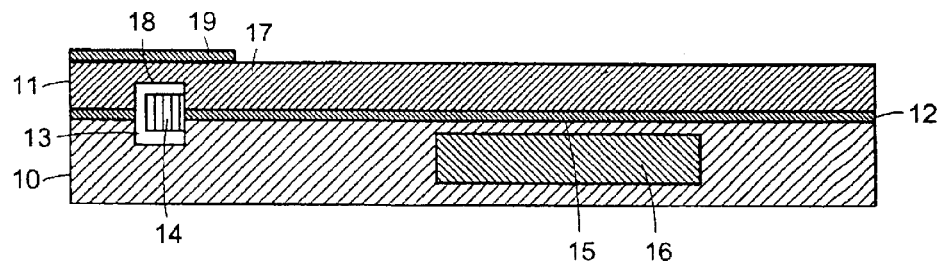
FIG. 12 is a schematic cross-sectional elevation view of a fluid-handling substrate suitable for use as a NMR detection module as disclosed here.
Figure 13A:
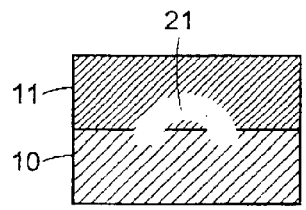
FIG. 13 is a schematic cross-sectional view of four alternative configurations for fluid channels in a probe module.
Figure 13B:
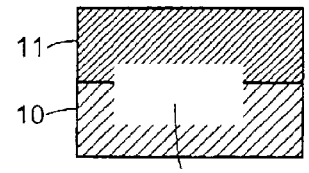
Figure 13C:
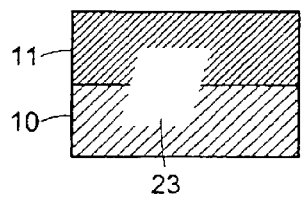
Figure 13D:
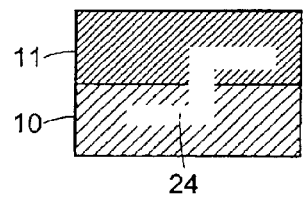

Referring to FIG. 12, a laminated substrate of a substrate-based module is seen to comprise, a first plastic piece 10 and a second plastic piece 11 welded together by selective IR irradiation of either the plastic pieces or by irradiation of an optional EM absorbing substance 12. The substrate contains a channel 13 formed by welding of the two plastic pieces together. Optionally contained within the channel 13 is an environmentally sensitive element 14. The substrate may also contain other channels formed from welding the plastic pieces together. A second channel 15 is in close and continuous contact with an embedded microdevice 16. A port 17 provides communication from the channel to the top or bottom planar surface of the substrate. Additionally, an external device may be connected to the fluid-handling substrate through the port. An optional gasket 18 may be used to enhance the fluid-tight seal around the channel. An optional EM absorbing layer 19 may be placed anywhere along the surface of the substrate. FIG. 13 shows cross-sectional views of four alternative configurations for fluid channels in the probe module. Such channels may be formed, for example, by welding module layers e.g. plastic pieces together. Possible configurations include, but are not limited to, semi-circular 21, rectangular 22, rhomboid 23, and serpentine 24. The channel configurations are limited only by the thickness of the materials forming the fluid-handling substrate.

In accordance with one embodiment, a NMR probe module comprises a substrate defining at least one fluid inlet port, and a fluid pathway comprising multiple channels in fluid communication with the at least one fluid inlet port, for the transport of fluid sample to be tested; multiple NMR detection sites each in fluid communication with at least one of the multiple channels, each comprising a sample holding void, and an associated RF microcoil; and a controllable fluid router operative in response to an electrical input signal to direct fluid sample in the module to at least a selected one of the multiple channels corresponding to the input signal.

The module may be any size and shape suitable to the intended application. In a preferred embodiment the module may be placed in a housing that forms a housing of the probe. In certain embodiments the probe is tubular or finger shaped and/or boxed-shaped to match the representative forms of NMR probes, with for example, a diameter of about one inch and a height of about 20–30 inches. In certain embodiments the module is generally planer. The term "generally planer" means card or cartridge-like, optionally being curvo-planar or otherwise irregular, but otherwise typically being rectangular or right-cylindrical, and having a thickness less than about a third, preferably less then one quarter, more preferably less than one fifth e.g. about one sixth or less, the largest dimension of major (i.e. largest) surface of the substrate. Other embodiments will be apparent given the benefit of this disclosure.

The microfluidic nature of the NMR probe modules disclosed here provides significant commercial advantage over conventional (larger scale, e.g. larger than capillary) fluidic NMR systems. Less sample fluid is required, which in certain applications can present significant cost reductions, both in reducing product usage (for example, if the test sample is taken from a product stream) and in reducing the waste stream disposal volume. In addition, the microfluidic substrate assemblies can, in accordance with preferred embodiments, be produced employing MEMS and other known techniques suitable for cost effective manufacture of miniature high precision devices.

The module may be made of any number of materials. Examples include metals, plastics, and silica. In a preferred embodiment the manifold comprises a substrate formed at least in part of polyetheretherketone (PEEK). PEEK is a high temperature resistant thermoplastic. PEEK has superior chemical resistance allowing for its use in harsh chemical environments, and it retains its flexural and tensile properties at very high temperatures. Additionally, glass and carbon fibers may be added to PEEK to enhance its mechanical and thermal properties. In another embodiment the module is a multi-layered laminate. Other embodiments will be apparent to one skilled in the art given the benefit of this disclosure.

In accordance with other embodiments the module further comprises a fluid outlet port in fluid communication with the fluid pathway. In other embodiments the module further comprises a fluid reservoir in fluid communication with the fluid pathway.

The fluid inlet port is where a fluid sample to be tested is introduced to the module. The fluid inlet port is typically sized to accommodate the amount of sample being tested. The inlet port may have any number of shapes. Examples include circular, square, trapezoidal, and polygonal. The inlet port may or may not also include additional filtering for the fluid sample to be tested. In certain embodiments there may be multiple inlet ports. Further embodiments will be apparent to one skilled in the art given this disclosure.

The fluid pathway transports the fluid sample to be tested though-out the module. In a preferred embodiment where the probe module is microfluidic the scale the multiple channels (sometimes referred to as microchannels) may be capillary in scale. The orientation of the channels may be any number of configurations. Examples include parallel, intersecting, overlapping, spiral, serpentine, and circular. The cross section of the channels may have any number of shapes as well. Examples include circular, square, trapezoidal, and polygonal. Further embodiments of size, shape, and orientation will be apparent to one skilled in the art given the benefit of this disclosure.

Figure 14:
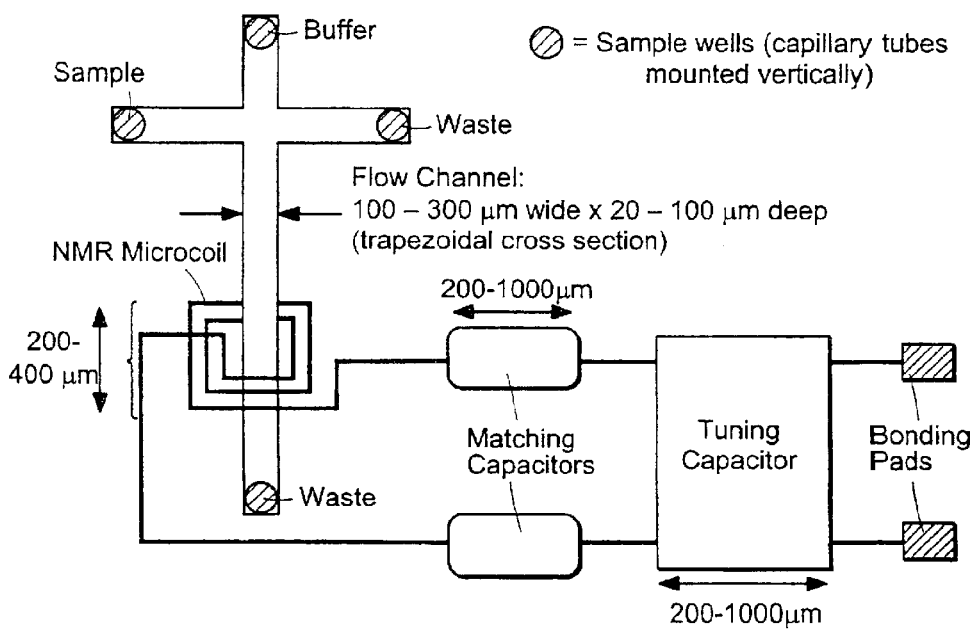
FIG. 14 is a schematic view of an NMR detection site in a probe module.

The multiple NMR sites are provided to allow for increased functionality and/or throughput. With multiple NMR sites the user is able to perform multiple NMR tests simultaneously which increased the rate in which results may be obtained. Furthermore the NMR detection sites may be optimized for different types of testing allowing a single probe to be used for a number of tests. In some embodiments each NMR site maybe in fluid communication with multiple channels of the fluid pathway. In accordance with preferred embodiments, the NMR detection sites further comprise matching capacitors and tuning capacitors, fluid connectors and data transmission means such as signal carrying leads or the like. An example of an NMR detection site can be seen in FIG. 14. Other embodiments will be apparent to one skilled in the art given the benefit of this disclosure.

The multiple NMR detection sites may be optimized using different materials. In a preferred embodiment the multiple NMR detection sites are made of fused silica and PEEK. In another preferred embodiment the multiple NMR detection sites are made of fused silica and Teflon. Other embodiments will be apparent to one skilled in the art given the benefit of this disclosure.

In a preferred embodiment the sample holding void is cylindrical in shape but it may also have any number other shapes, most notably spherical. Examples of cross-sectional configurations include round, rectangular, triangular, etc. In a preferred embodiment the sample holding void is 5 um to 500 um, more preferably 25 um to 50 um. In a preferred embodiment the microcoil surrounds around a portion of the void. Preferably the microcoil is made of copper but may be made of any number of other conductive or superconductive materials depending on the desired properties. The microcoil typically is 250 um to 1 mm in axial direction. In preferred embodiments the microcoil may be helical, solenoidal or spiral and in other preferred embodiments the microcoil may be planar. Other embodiments of coil geometry will be apparent to one skilled in the art given the benefit of this disclosure.

In the NMR probe module configuration disclosed here, each of the NMR detection sites is separate and therefore, optionally, can hold unique samples for testing. In this regard, the probe modules integrate a multiplicity of detectors with greater functionality enhancement than would be achieved by wrapping a multiplicity of detection coils around a single sample. The microcoil, void, and sample are magnetically matched, and the NMR detection sites in accordance with preferred embodiments are operative to obtain high resolution NMR spectra. The microcoil is positioned to within 1 mm, more preferably to within less than 100 um of the sample boundary. The incorporation of multiple microcoils and multiple corresponding voids complicates magnetic matching, but will be within the ability of those skilled in the art given the benefit of this disclosure and applying known principles. Preferably, at least one detection coil is optimized for high resolution proton detection, whereas other coils may be optimized for heteronuclear or multi-dimensional homonuclear experiments. In two-dimensional experiments such as correlation spectroscopy (COSY) or total correlation spectroscopy (TOCSY), and in heteronuclear experiments the digital resolution in the f1 dimension is relatively coarse (typically 128–256 data points). The number of data points in the f2 dimension (typically 512) is, therefore, considerably reduced compared to one-dimensional experiments, and the acquisition time is similarly reduced (~200 ms at 250 MHz, and shorter at higher operating frequencies). Consequently, the resolution requirements of coils intended for 2-D acquisition is considerably lower due to the larger spectral linewidths (typically 2–4 Hz) in 2-D experiments. For example, in an embodiment with 2 detection sites, a primary coil can be optimized for resolution while a secondary coil can be optimized for heteronuclear acquisition.

The functionality of the NMR probe module is dependent, in part, upon the reception of separate signals from the individual coils (and impedance matching networks) that comprise the NMR detection site. Regardless of the form of signal acquisition (independent acquisition using multiple receivers, or time-multiplexed acquisition using RF switches), quasi-simultaneous acquisition demands a high degree of isolation between the microcoils and matching circuits at each nuclear frequency of interest. The coils can be positioned with spatial separation and orthogonal geometric orientation to reduce coupling. Similarly, the impedance matching circuits can be shielded and positioned in the probe in such a manner to reduce coupling.

In accordance with another preferred embodiment, the timing constraints of a multiplexed system for NMR applications (where timing is a critically important parameter) can be addressed by the use of a multiple transceiver NMR spectrometers.

This advance of high potential significance is made technically possible due to the relative size of the RF microcoil (typically 1 mm diameter) when compared to the overall size of the (shimmed) region of field homogeneity in the NMR magnet. Magnets are typically designed for conventional RF coils and samples as large as 1 cm in diameter and extending (vertically) several centimeters in length. By reducing the size of the RF coil by as much as 10-fold, the possibility of incorporating several coils into one magnet becomes feasible. The order-of-magnitude advantages in mass sensitivity (when compared to conventional NMR probes) achieved using a NMR probe module disclosed here, and the chromatographic resolution that can be achieved and maintained (e.g. when employing liquid chromatography for sample preparation) at the capillary-scale have been extensively documented.

Important advantages obtained by employing preferred embodiments of the NMR probe module disclosed here include high throughput due to parallelism of detectors, while retaining the inherent gains in mass sensitivity and chromatography afforded at the capillary size scale and using microcoils, individual optimization of RF coil sensitivity to different nuclei (1H, 1H{15N}, 1H{13C}, etc.), e.g. where peaks are routed sequentially through a series of optimized detectors (thereby saving the money and time associated with use of multiple probes while still preserving uncompromised sensitivity, time optimization of data acquisition, e.g. by using a dedicated coil for rapid 1-D analysis while reserving another for 2-D, longer acquisition NMR experiments, and the creation of a platform for eventual integration o intelligent sample manipulation and NMR analysis, whereby the directed routing of analyte peaks can be accomplished based upon the content of the peak (using an appropriate sample management technology).

Li et al. (Li 1999 Anal. Chem. 71 4815–4820) describes a 4-coil assembly illustrative of certain aspects of the present disclosure. The solenoidal microcoils are mounted on horizontal (transverse to Bo) capillaries with a 90 degree rotation (x, y) and 5 mm vertical spacing between adjacent coils. Additional details of basic construction are known generally, as shown in the Li et al reference mentioned above. The Li et al. microcoils were fabricated using techniques previously described in detail (Olson et al., Anal. Chem. 70, pp.257A–264A, 1998, and Webb et al., J. Magn. Reson. B 113, pp. 83–87, 1996). A four-coil system was constructed for operation in a 250 MHz wide-bore (89 mm) magnet; a two-coil system could be accommodated in either a narrow-bore (54 mm) or wide-bore 500 MHz magnet. For the four-coil system, each coil was fabricated identically using 17 turns of 50 $\mu$m diameter copper wire with a 6 $\mu$m thick polyurethane coating (California Fine Wire, Grover Beach, Calif.) wrapped around a 355 $\mu$m outer diameter, 180 $\mu$m inner diameter polyimide-coated fused silica capillary (Polymicro Technologies, Phoenix, Ariz.), giving an observe volume (Vobs) of 28 nL. The microcoils were mounted one above the other with a vertical spacing of 5 mm between adjacent coils. Alternate coils were rotated 90° with respect to each other to reduce coupling. The whole system was surrounded by a container filled with FC-43. For the 2-coil system at 5010 MHz, the microcoils were constructed as described above, one on a 75 $\mu$m i.d. 360 $\mu$m o.d. capillary (Vobs=5 nL) and the other on a 200 $\mu$m i.d. 360 $\mu$m o.d. capillary (Vobs=31 nL). The coils were then mounted on double-sided printed circuit boards. The capillaries were oriented at the magic angle with respect to the BO field, and the two boards attached back-to-back with copper shielding between the boards. The matching networks were designed to maximize the distance between the elements of the two circuits, with the microcoils separated by 5 mm transversely with respect to the BO field. The NMR probe modules disclosed here differ from such earlier devices in having multiple detectors, each having a detection site, i.e., as described above, void in the capillary microchannel to receive a test sample, and having an NMR microchannel aligned therewith.

It is generally preferred to immerse the diamagnetic wire of the microcoil in a diamagnetic matching medium with magnetic susceptibility equal to that of the wire. Suitable software is commercially available for use in determining determine inter-coil spacing, coil orientations, and other geometrical tradeoffs for optimum resolution, for example, Maxwell 3D (Ansoft Corporation, Pittsburgh, Pa.). Preferably, greater than 30 dB RF isolation is achieved between coils. Coil-to-coil coupling would result in crosstalk and interference in the received signals. RF coupling is typically minimized by geometrically positioning electrical components so that the orientation of the magnetic and/or electric fields in adjacent components are orthogonal. Adjacent components are also placed as far apart as is practical to maintain functionality but minimize coupling.

Figure 15:
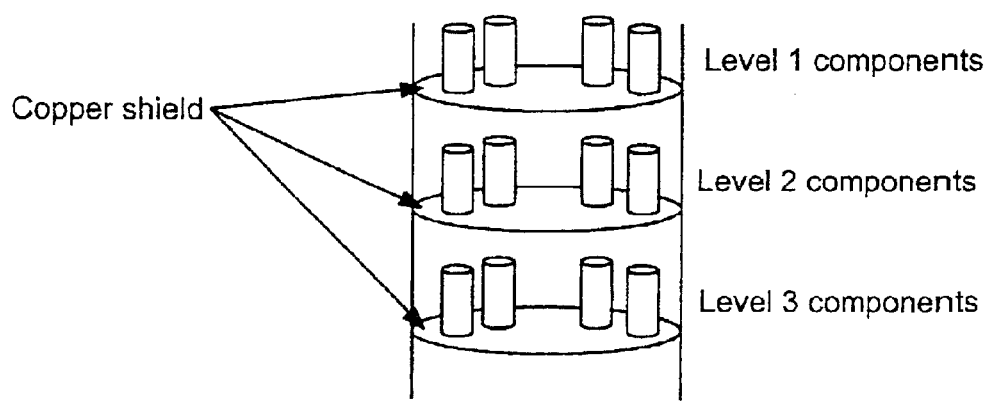
FIG. 15 is a schematic view of a probe module, showing preferred placement and orientation of impedance matching elements.

Shielding (via insertion of a conducting plane) can be used effectively for elimination of electric field coupling, albeit at the expense of an increased effective resistance (and noise) due to induced eddy currents in the shield. The increased resistance typically manifests as a lowered quality factor (Q) for the resonant circuit. Magnetic field coupling is more difficult to restrict, as the lines of magnetic flux close upon themselves. In non-magnetic environments, high permeability (mu) metals are employed, but these materials are precluded in NMR due to their effect on field homogeneity. Preferably a combination of orientation and spacing for minimization of coupling are used. Preferably the matching networks are spatially separated in the probe. FIG. 15 illustrates an exemplary probe layout demonstrating spatial and electrical separation of RF impedance matching circuit components, e.g. to achieve isolation in 1H/2H circuits. The NRM probe modules disclosed here preferably employ a multi-level geometry, where adjacent matching networks can be shielded using copper sheets or the like, that isolate the electric fields of one matching circuit on one level of the probe from those of another on a different level of the probe. Circuit modeling, e.g., using a commercial RF package such as Linc2 available from Applied Computational Sciences (Escondido, Calif.) can be employed to help guide the design. A variety of options exist for further probe modification, including the incorporation of additional shielding to partition adjacent circuits on the same level.

The NMR probe module may have each of the multiple NMR detection sites optimized differently with any of the combinations discussed above or any other that may be apparent to one skilled in the art given the benefit of this disclosure.

The microchannels and associated NMR microcoils can be formed in a module, preferably a multi-layer substrate, such as a laminated multi-layer substrate, e.g., a selectively welded multi-layer substrate as disclosed in copending U.S. patent application Serial No. 60/239,010 filed on Oct. 6, 2000, the entire disclosure of which is incorporated herein by reference for all purposes. Microlithographic microcoils can be employed in such laminate substrates, such as those disclosed in the above-mentioned U.S. Pat. No. 5,684,401, the entire disclosure of which is incorporated herein by reference for all purposes. Alternatively, or in addition, one or more of the multiple NMR detector sites formed in the probe can be formed in a finger or peninsula-type extension of the substrate, and the microcoil can be formed as a separate 3-dimensional structure fitted over such substrate projection. It will be within the ability of those skilled in the art, that is, those skilled in this area of technology, given the benefit of this disclosure, to employ alternative suitable fabrication techniques for production of the multi-microcoil NMR detection probes disclosed here.

The controllable fluid router, which may be referred to as a form of a sample management engine, is operative in response to an electrical input signal to direct fluid sample in the module to at least a selected one of the multiple channels corresponding to the input signal. The fluid router may direct all or part of the fluid sample to one, multiple, or all of the channels in the fluid pathway. There are many ways the router could be implemented. For example, in one embodiment the router may consist of individual valves for each channel of the fluid pathway that are individually controlled by an electrical input signal. In another embodiment the router may perform cross routing of sample from one channel to another and be controlled entirely by one input signal. In a preferred embodiment the fluid router is a sample management engine to selectively deliver and, optionally, selectively withdraw fluid samples from the microchannels of the probe. Preferably samples are fed into the microchannel of one or more of the probe's multiple detectors at a flow rate sufficiently low to maintain laminar flow. In another embodiment, the fluid routing functionality can be incorporated into one or more sample management modules. Other embodiments will be apparent to one skilled in the art given the benefit of this disclosure.

In accordance with another embodiment the controllable router receives the electrical input signal from a controller unit. The controller unit may be any number of devices including, for example, a circuit, computer, microprocessor or microcontroller. The controller unit may be located remotely or be incorporated in the module. The controller may optionally be connected to various sensor units as discussed in this specification. The input signal delivered by the controller unit may be software or hardware generated. The controller may or may not be in direct or indirect communication with the NMR sites.

In accordance with another embodiment the NMR sites are in communication with a data processing unit. The data processing unit may be any number of devices including, for example, a circuit, computer, or microprocessor. The data processing unit may be located remotely or be incorporated in the module. The data processing unit may optionally be connected to various sensor units as discussed in this specification. The controller may or may not be in direct or indirect communication with the fluid router.

In some embodiments the module probe may have both the controller unit and the data processing unit. In other embodiments the controller unit and data processing unit are in communication with each other. In still other embodiments one device, for example, a computer performs the functions of both. In another example, a microprocessor incorporated into the module performs the functions of both devices. Other embodiments will be apparent to one skilled in the art given the benefit of this disclosure.

In accordance with another embodiment, connectivity between the NMR detection sites and the controllable fluid router comprise a feedback and control link. That is, sample data acquired from the NMR detection site is processed and fed back to the fluid router as the feedback element to tie the specific steps of the fluid router to the NMR detector site. In certain preferred embodiments, data acquired from one NMR detection site of the probe module is output by the system, optionally as one of multiple output signals to control some aspect of the system, especially, e.g., to determine further operation of the probe on a sample or samples, such as whether microcoil NMR tests and/or or other action(s) or storage of the sample should be conducted or other operations of the probe module performed. Especially significant in this regard is the electronic connection (e.g., by hard wire connection, wireless connection etc.) of the NMR probe to a data processing/controller unit that is responsive to the signals generated by the NMR detection site corresponding to the NMR test data generated by the sample. The data processing/controller unit advantageously is responsive to the signals, programmed to detect and electronically recognize or identify molecular structure or analyte composition (e.g., by automatic comparison of NMR data against a pre-stored database of such data), and to act automatically on at least selected possible test results (e.g., those pre-flagged in the database with any of several possible values corresponding to different follow-on actions initiated by the controller. In accordance with preferred embodiments, the data processing/controller unit is responsive to the test data signal to direct storage, disposal or movement of the sample from the current NMR detection site to selected other NMR detection sites and/or other analytical sites or components of the system, e.g., by causing pumping of volume corresponding to the length of the flow path to the other site, and/or by controlling gates for selecting amongst multiple possible flowpaths.

A wide array of sample management forms may be employed in operative communication with the probe. The probe module may operatively communicate with a larger system that performs sample preparation. In one embodiment the module is connected to or part of a liquid chromatography system. In another embodiment the module is connected to or part of a capillary electrophoresis system. In another embodiment the module is connected to or part of a dynamic filed gradient focusing system. In some embodiments the sample preparation may also be incorporated in the probe module as discussed in this specification. In certain preferred embodiments wherein the channels and associated NMR microcoils are formed in a module, a liquid feed line (inside diameter preferably 5 microns to 500 microns, more preferably 25 to 50,) may connect to a port sited in the surface of the module from any of numerous commercially available sample management engines can be used, such as the Capillary Liquid Chromatography system from Waters Corporation, Milford, Mass., USA. As discussed further below, capillary-LC/micro-NMR systems are especially preferred embodiments of the system aspect of this disclosure. Peaks and/or samples, preferably already conditioned, purified, concentrated, etc., coming into the probe from the separation engine would be routed accordingly. Examples of such systems can be seen in FIG. 2.

In accordance with certain preferred embodiments, peaks and/or samples, optionally already conditioned, purified, concentrated, etc., are fed into the probe from a separation engine and are routed to the appropriate NMR detection site or, optionally may be "siderailed" until later analysis can be complete with the same coil or directed to a separate detection coil for essentially parallel analysis. That is, samples may be "siderailed" within the multi-microcoil NMR detection probe, either before or after any NMR analysis has been performed on it. Analysis may be performed on the siderailed sample at that time or at a later time. Later analysis may be performed with the same microcoil already used or the sample may be directed to a different coil for essentially parallel analysis. Any of the channels of the probe may be branched or otherwise provide one or more stations at which a sample can be stored. Preferred embodiments of the probe use a controllable router for releasably or permanently retaining a sample in a void within the NMR detection site, or other retainer or plug suitable to prevent unintended loss of the sample during testing or storage. Similarly, samples can be moved externally of the probe, from the void of one channel to that of another channel within the probe.

Other embodiments will be apparent to one skilled in the art given the benefit of this disclosure.

In accordance with a highly innovative aspect of certain preferred embodiments of the invention, a multi-detector microcoil NMR probe as disclosed above receives a test sample and retains it for delayed or further future testing. Especially in such applications as proteomics and the like, where typically only a minute quantity of a particular analyte is available, storage in the micro-scale NMR detection site of the probe module avoids unwanted additional transfers of the analyte and provides a secure and protective storage site that readily facilitates future testing. Other embodiments will be apparent to one skilled in the art given the benefit of this disclosure.

In accordance with another embodiment, a NMR probe module comprises at least one fluid inlet port, a fluid pathway comprising multiple channels, in fluid communication with the at least one fluid inlet port, for the transport of fluid sample to be tested; at least one operative component in communication with the fluid pathway, multiple NMR detection sites each in fluid communication with at least one of the multiple channels, each comprising as sample holding void, and an associated RF microcoil; and a controllable fluid router operative in response to an electrical input signal to direct fluid sample in the module to at least a selected one of the multiple channels corresponding to the input signal.

The operative component can be any number of devices that interact with the fluid in the module including, for example, sensors, sample preparation devices, pumps, heaters, coolers, ultrasonic devices and even additional NMR sites. The operative component may also be any number of devices that do not interact with the fluid. Examples, for instance, include microprocessors, microcontrollers and memory module. In some embodiments the operative component is in electrical communication with the controllable gate. In certain preferred embodiments the operative component is incorporated into the probe, e.g., integrated on-board the module. In other preferred embodiments the operative component is selectively removable. Having the operative component selectively removable allows for swapping of different operative components allowing for greater configuration flexibility. In other embodiments the operative component is in communication with the one or more of the NMR detector sites. The operative device may also optionally in communication with a controller unit, a data processing unit or both. In other embodiments there may be multiple operative components in any of the configuration discussed above or below, which may or may not be in communication with each other. Other embodiments will be apparent to one skilled in the art given the benefit of this disclosure.

In one embodiment the operative component is an IR detector, a photodiode array or the like. In still another embodiment the operative component is a UV visibility array. In some embodiments the operative component is an LC device. In other embodiments the operative component is a CE device. Other embodiments will be apparent to one skilled in the art given the benefit of this disclosure.

In some embodiments the operative component is a pump. In other embodiments the operative component is a heating device. In still other embodiments the operative component is a sonication device. In another embodiment the operative component is a reaction site. Other embodiments will be apparent to one skilled in the art given the benefit of this disclosure.

In embodiments with a microprocessor or microcontroller the operative component may act as a controller unit, a data processing unit, or both. In embodiments where the operative device is a memory module the device may store data about the probe such as its configuration, when and where it was made, etc. In other embodiments the memory module may store data from the NMR sites or other operative components incorporated into the module. Other embodiments will be apparent to one skilled in the art given the benefit of this disclosure.

In accordance with another aspect, an NMR probe module comprises a substrate defining at least one fluid inlet port, operative to receive a fluid; fluid pathway; and multiple NMR detection cells. In certain preferred embodiments the NMR probe module further comprises a controllable fluid router as described above. The fluid pathway comprises multiple channels and is in fluid communication with the inlet port. The multiple NMR detection cells are each in fluid communication with at least one of the multiple channels of the fluid pathway. Each NMR detection cell comprises an enlarged void for holding a fluid sample, and an associated microcoil. The controllable fluid router is operative in response to an electrical input signal to direct fluid sample in the module to at least a selected one of the multiple channels corresponding to the input signal. Preferably the NMR detection cell comprises at least one RF detector microcoil associated with an enlarged void, that is, an enlarged sample chamber in a capillary, or channel. The inner diameter of the channel enlarges to form the enlarged void, preferably with conical tapering at each end of the void. The void may extend axially in the channel beyond the microcoil. Optionally, one or more of the multiple channels in the NMR probe module forms more than one enlarged void, each with an associated NMR microcoil. In accordance with preferred embodiments, the inner diameter of the channel on either side of the enlarged void is 5 um to 500 um, more preferably 25 um to 50 um, the conical taper of the channel at each end of the void preferably is at an angle to the longitudinal axis of about 5 to 75 degrees, e.g., about 30 degrees, and the inner diameter of the enlarged void between the conically tapered portions preferably is substantially uniform and from 100 um to 1 mm, more preferably 250 um to 800 um. The microcoil is positioned to axially surround the void, typically being about 250 um to 1 mm in the axial direction.

We claim:

1. A NMR probe module comprising:
a least one fluid inlet port, operative to receive a fluid sample,
a fluid pathway comprising multiple channels in fluid communication with the at least one fluid inlet port, for the transport of fluid sample to be tested;
multiple NMR detection sites, each in fluid communication with at least one of the multiple channels, each comprising:
a sample holding void, and
an associated NMR microcoil, wherein each NMR microcoil is operative to detect one or more analytes in the sample holding void with which the NMR microcoil is associated;
a controllable fluid router operative to direct fluid sample in the module to at least a selected one of the multiple channels; and
an analyte extraction chamber in fluid communication with at least one of the NMR detection sites, wherein the analyte extraction chamber is operative to perform dynamic field gradient focusing.

2. A NMR probe module comprising:
at least one fluid inlet port, operative to receive a fluid sample,
a fluid pathway comprising multiple channels in fluid communication with the at least one fluid inlet port, for the transport of fluid simple to be tested;
multiple NMR detection sites, each in fluid communication with at least one of the multiple channels, each comprising:
a sample holding void, and
an associated NMR microcoil, wherein each NMR microcoil is operative to detect one or more analytes in the sample holding void with which the NMR microcoil is associated;
a controllable fluid router operative to direct fluid sample in the module to at least a selected one of the multiple channels; and
an analyte extraction chamber in fluid communication with at least one of the NMR detection sites, wherein the analyte extraction chamber is operative to perform electric field gradient focusing.

* * * * *